United States Patent
Büthker et al.

(10) Patent No.: US 11,047,919 B2
(45) Date of Patent: Jun. 29, 2021

(54) OPEN WIRE DETECTION SYSTEM AND METHOD THEREFOR

(71) Applicant: NXP B.V., Eindhoven (NL)

(72) Inventors: Henricus Cornelis Johannes Büthker, Mierlo (NL); Marijn Nicolaas van Dongen, Utrecht (NL)

(73) Assignee: NXP B.V., Eindhoven (NL)

( * ) Notice: Subject to any disclaimer, the term of this patent is extended or adjusted under 35 U.S.C. 154(b) by 10 days.

(21) Appl. No.: 16/143,851

(22) Filed: Sep. 27, 2018

(65) Prior Publication Data
US 2020/0103466 A1 Apr. 2, 2020

(51) Int. Cl.
*H02J 7/00* (2006.01)
*G01R 31/396* (2019.01)

(52) U.S. Cl.
CPC .................. *G01R 31/396* (2019.01)

(58) Field of Classification Search
CPC ............. H02J 3/14; H01L 2924/19041; H01L 2924/19042; H01L 2924/19043; B60K 31/00; B60K 2370/152; G01R 31/54; G01R 31/58; B60L 2270/145; B60R 16/023; H03L 7/0995; H01Q 1/2225
USPC .................................................. 320/126–136
See application file for complete search history.

(56) References Cited

U.S. PATENT DOCUMENTS

| | | | |
|---|---|---|---|
| 7,683,796 B2 | 3/2010 | Stad et al. | |
| 2008/0084323 A1* | 4/2008 | Stad | G05B 9/02 340/652 |
| 2011/0034964 A1* | 2/2011 | Bi | A61N 1/025 607/5 |
| 2012/0081128 A1 | 4/2012 | Laber et al. | |
| 2013/0041606 A1 | 2/2013 | Tang et al. | |
| 2013/0181514 A1 | 7/2013 | Ikeda et al. | |
| 2013/0293251 A1* | 11/2013 | Martin | B60L 3/04 324/750.3 |
| 2015/0260799 A1 | 9/2015 | Kuroda | |
| 2016/0003914 A1 | 1/2016 | Allen et al. | |

FOREIGN PATENT DOCUMENTS

CN 205463703 U 8/2016

OTHER PUBLICATIONS

Ito, T., "Evaluation of detecting the breaking of wires on medium-voltage system by three-phase sensors", IEEE 2015.
Ono, A., "Pin Open Detection of BGA IC by Supply Current Testing", ICEP Proceedings 2014.
Umezu, S., "A Built-in Supply Current Test Circuit for Pin Opens in Assembled PCBs". ICEP Proceedings 2014.

* cited by examiner

*Primary Examiner* — Binh C Tat

(57) ABSTRACT

An open wire detection system and method are provided. A semiconductor device includes a first diode having an anode terminal coupled to a first terminal and a cathode terminal coupled to a second terminal. The first and second terminals are configured for connection to a first battery cell terminal by way of a first conductive path and a second conductive path. A detect circuit is coupled to the first diode and is configured to provide a first open wire indication when a first voltage across the first diode exceeds a first threshold.

20 Claims, 4 Drawing Sheets

400

OPEN WIRE DETECTION SYSTEM AND METHOD THEREFOR

BACKGROUND

Field

This disclosure relates generally to circuits, and more specifically, to an open wire detection system.

Related Art

Today, a broad range of products from cell phones to electric vehicles, for example, are powered by rechargeable batteries. Semiconductor devices including battery management circuits are generally connected to terminals of the rechargeable batteries to control charging and monitor the state of charge, health, and other parameters of the batteries. In safety critical applications, loss of a connection to a terminal of a battery can have dire affects. Therefore, a need exists for improved safety in the case of an open circuit condition.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a battery management system that includes open wire detection. A diode circuit is coupled between terminals of a battery management unit. The terminals of the battery management unit are connected to terminals of a battery cell by way of conductive paths. Monitor circuitry of the battery management unit is configured to monitor a voltage across the diode circuit. An open circuit in a conductive path is detected when a voltage across the diode circuit exceeds a predetermined threshold.

Figure 1:
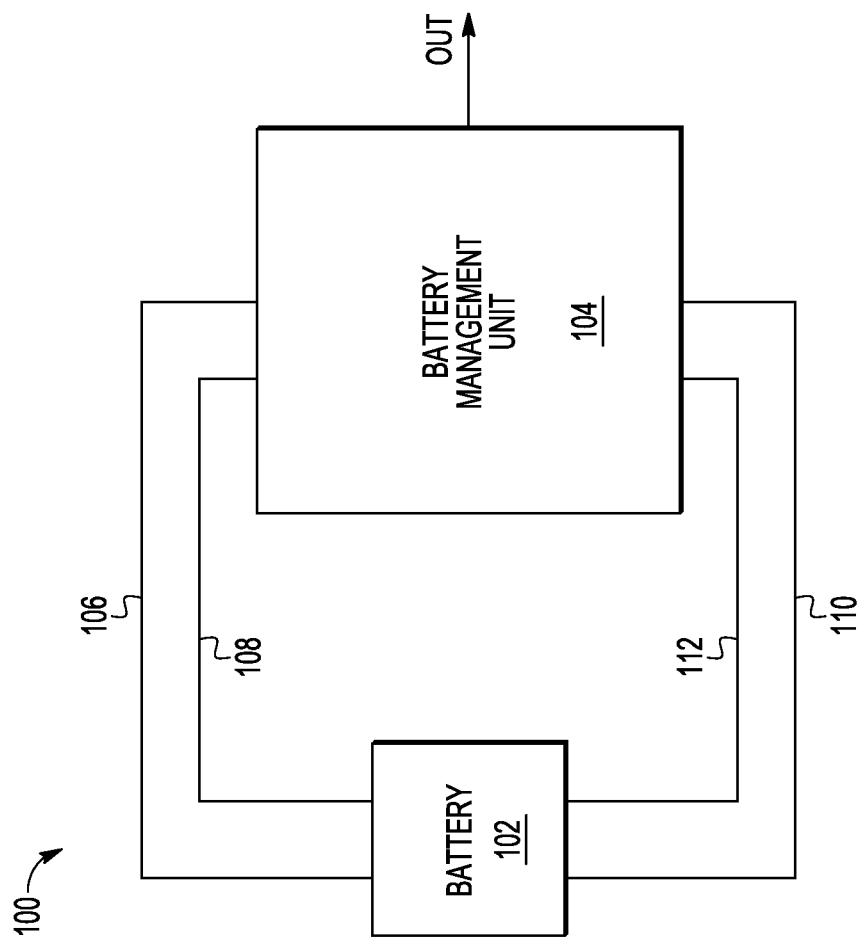
FIG. 1 illustrates, in simplified block diagram form, an example battery management system in accordance with an embodiment.

FIG. 1 illustrates, in simplified block diagram form, an example battery management system 100 in accordance with an embodiment. System 100 includes a battery cell 102 and a battery management unit 104. Battery cell 102 may be any suitable rechargeable battery cell (e.g., lithium ion, sealed lead acid). Battery management unit 104 is formed as an integrated circuit and serves to manage and monitor the state of charge, health, and operating conditions of the battery cell 102. The battery management unit 104 includes storage circuitry (e.g., registers, memory) for storing parameters (e.g., battery health, conditions) and communication circuitry for communicating stored parameters with other battery management units and/or a main battery management controller by way of output labeled OUT.

In this embodiment, battery management unit 104 includes circuitry for open wire detection which is a safety critical feature when employed in vehicles (e.g., automobiles, trucks). The battery management unit 104 includes terminals for connections to battery cell 102. Conductive paths 106-112 provide electrical connections between the positive (+) and negative (−) terminals of battery cell 102 and respective terminals (HB, HS, LB, LS) of the battery management unit 104. The conductive paths 106-112 include wiring, conductive traces on a printed circuit board, solder connections, and the like, which forms the electrical connections between the battery cell 102 and the battery management unit 104. In this embodiment, a first conductive path 106 is coupled between the positive terminal of battery cell 104 and the high-side battery terminal labeled HB. Likewise, a second conductive path 108 is coupled between the positive terminal of battery cell 102 and the high-side sense terminal labeled HS. A third conductive path 110 is coupled between the negative terminal of battery cell 102 and the low-side battery terminal labeled LB, and a fourth conductive path 112 is coupled between the negative terminal of battery cell 102 and the low-side sense terminal labeled LS.

In the event that an open circuit occurs in any of conductive paths 106-112, an open wire error indication is stored and communicated with the main battery management controller by way of the output OUT. The term "open wire" as used herein, refers to an open circuit in a conductive path (e.g., conductive paths 106-112). The electrical connections formed by conductive paths 106 and 110 are used to provide an operating voltage (e.g., by way of the battery cell 102) to circuitry of the battery management unit 104. The electrical connections formed by conductive paths 108 and 112 are used by the battery management unit 104 to sense or monitor voltage levels of the battery cell 102.

Figure 2:
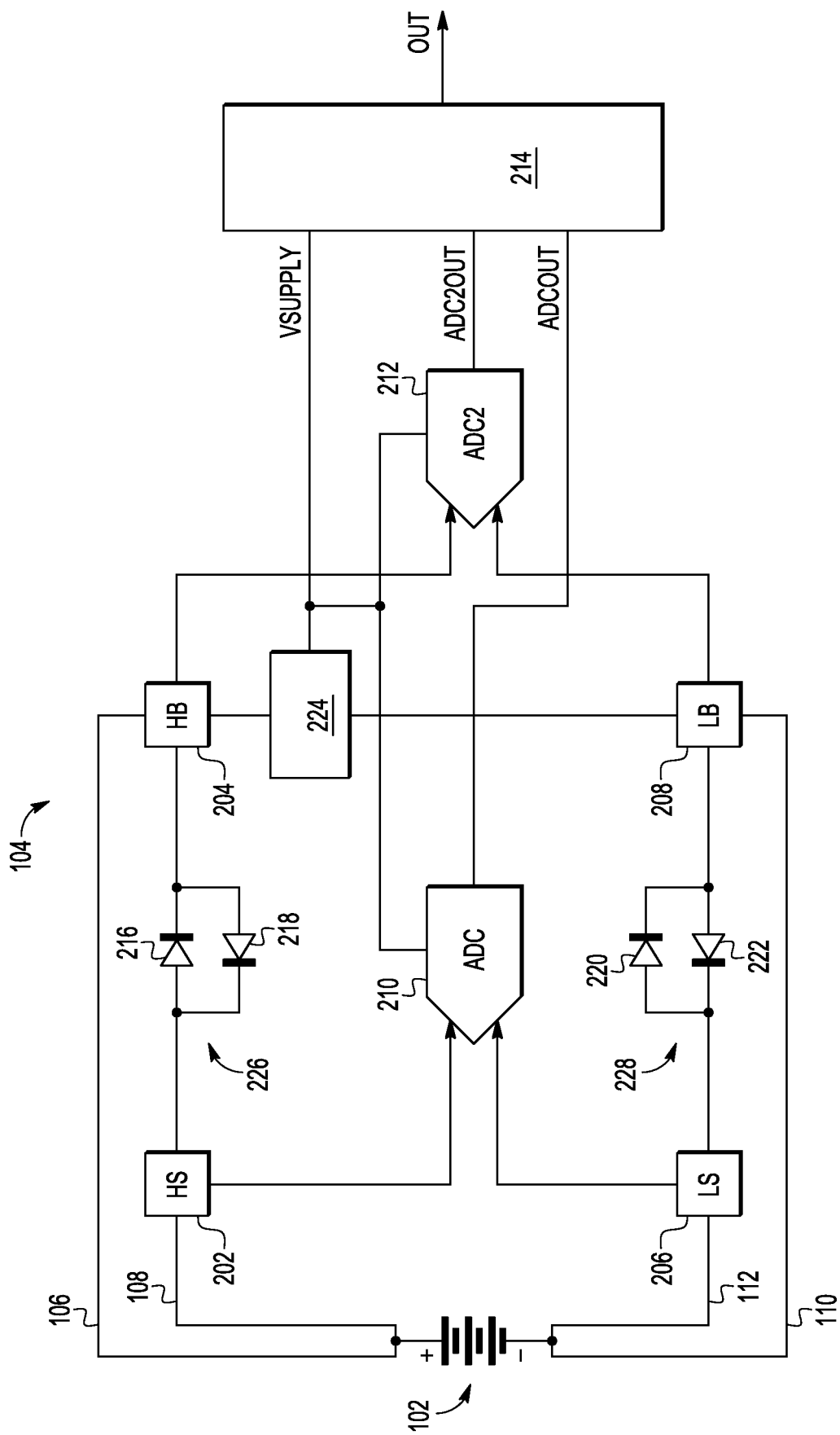
FIG. 2 illustrates, in schematic diagram form, a first example of a more detailed battery management system in accordance with an embodiment.

FIG. 2 illustrates, in schematic diagram form, a first more detailed example battery management system 200 in accordance with an embodiment. System 200 includes battery cell 102 and battery management unit 104 shown in more detail. As described above, the battery cell 102 may be any suitable rechargeable battery cell type. In this embodiment, battery management unit 104 is formed as an integrated circuit and includes circuitry for open wire detection.

In this embodiment, the battery management unit 104 includes terminals 202-208 labeled HB, HS, LB, and LS respectively for electrical connections to battery cell 102, diode circuits 226 and 228, a first analog to digital converter (ADC) 210, a second ADC 212, logic block 214, and voltage regulator 224. Terminals HB, HS, LB, and LS may be in the form of bonding pads or package terminals of the battery management unit 104, for example. Conductive paths 106-112 provide electrical connections between the positive (+) and negative (−) terminals of battery cell 102 and respective terminals HB, HS, LB, and LS of the battery management unit 104. The conductive paths 106-112 include wiring, conductive traces on a printed circuit board, solder connections, and the like, which forms the electrical connections between the battery cell 102 and the battery management unit 104. In this embodiment, a first conductive path 106 is coupled between the positive terminal of battery cell 104 and the high-side battery terminal labeled HB, and a second conductive path 108 is coupled between the positive terminal of battery cell 104 and the high-side sense terminal labeled HS. Likewise, a third conductive path 110 is coupled between the negative terminal of battery cell 104 and the low-side battery terminal labeled LB, and a fourth conductive path 112 is coupled between the negative terminal of battery cell 104 and the low-side sense terminal labeled LS.

First diode circuit 226 is coupled between the HS and HB terminals and second diode circuit 228 is coupled between the LS and LB terminals of the battery management unit 104. The first diode circuit 226 includes a first diode 216 and a second diode 218 arranged in an antiparallel configuration. The term "antiparallel" as used herein, refers to a pair of diodes connected in parallel with reverse polarities. In this arrangement, diode 216 has an anode terminal connected to the HS terminal and a cathode terminal connected to the HB terminal, and diode 218 has a cathode terminal connected to the HS terminal and an anode terminal connected to the HB terminal. The second diode circuit 228 includes a first diode 220 and a second diode 222 arranged in an antiparallel configuration. In this arrangement, diode 220 has an anode terminal connected to the LS terminal and a cathode terminal connected to the LB terminal, and diode 222 has a cathode terminal connected to the LS terminal and an anode terminal connected to the LB terminal.

First ADC 210 labeled ADC is configured to monitor and measure voltages at the HS and LS terminals respectively. ADC 210 includes a first input coupled to the HS terminal, a second input coupled to the LS terminal, and an output labeled ADCOUT coupled to the logic block 214 for providing digital conversion values representative of measured voltages at the HS and LS terminals. Second ADC 212 labeled ADC2 is configured to monitor and measure voltages at the HB and LB terminals respectively. ADC 212 includes a first input coupled to the HB terminal, a second input coupled to the LB terminal, and an output labeled ADC2OUT coupled to the logic block 214 for providing digital conversion values representative of measured voltages at the HB and LB terminals. In an embodiment, ADC 210 is characterized as a high-resolution ADC (e.g., 12-bit ADC) and ADC 212 is characterized as a low-resolution ADC (e.g., 8-bit ADC). In other embodiments, both ADCs 210 and 212 may be characterized as high-resolution ADCs.

ADC 210 and ADC 212 along with logic block 214 serve as a detect circuit configured to determine that an open wire exists on conductive paths 106-112 when monitored voltages across the diode circuits 226 and 228 exceed predetermined thresholds, store an open wire error indication, and communicate such error indication with the main battery management controller by way of the output OUT. The diode circuits 226 and 228 serve as detection diode circuits configured for detecting the open wire by having a detectable voltage across the detection diode circuits when the open wire exists. In an embodiment, the first and second diode circuits 226 and 228 are formed as electrostatic discharge (ESD) diode circuits and are utilized as the detection diode circuits. In this arrangement, the first and second diode circuits 226 and 228 are configured to protect circuitry of the battery management unit 104 during ESD events at the HS, HB, LS, and LB terminals in addition to serving as detection diode circuits. In an embodiment, communications circuitry of logic block 214 for communicating with the main battery management controller may be a serial communication interface. In other embodiments, other communication circuitry for communicating with the main battery management controller may be employed.

Logic block 214 includes logic circuits configured to perform control, computational, operational, and communication functions among other functions. The logic block 214 is coupled to receive conversion values from ADCs 210 and 212 that are representative of voltages measured at HB, HS, LB, and LS terminals respectively. From these conversion values, voltages across the diode circuits 226 and 228 are determined. In a first example, when conductive paths 106 and 108 are intact, the voltage measured at the HS terminal is approximately the same as the voltage measured at the HB terminal. In turn, circuitry in the logic block 214 performs a subtraction operation using the measured voltage values as operands and provides a result. In this example, the result is approximately 0 (zero) volts measured across diode circuit 226.

In a second example, when an open circuit occurs in conductive path 106, the voltage measured at the HB terminal is significantly lower than the voltage measured at the HS terminal. Because the HB terminal is no longer connected to the battery terminal, a voltage drop occurs across the diode circuit 226. Performing a subtraction operation (e.g., HS terminal voltage minus HB terminal voltage) in the logic block 214 using the measured voltage values as operands provides a result of as much as approximately a diode threshold voltage measured across diode circuit 226. In this example, the measured voltage across diode circuit 226 may be in a range of 100 to 700 millivolts. A first predetermined error threshold value may be set at +50 millivolts, for example, in a control register of logic block 214. The measured voltage is compared with the error threshold value and when exceeded, the logic block 214 generates an HB open wire error indication. Because the measured voltage across diode circuit 226 exceeds the first predetermined error threshold, the HB open wire error indication may be stored as a flag in an error register of logic block 214 and communicated with a main battery management controller by way of communications circuitry of logic block 214 at output OUT.

In a third example, when an open circuit occurs in conductive path 108, the voltage measured at the HS terminal is significantly lower than the voltage measured at the HB terminal. Because the HS terminal is no longer connected to the battery terminal, a voltage drop occurs across the diode circuit 226. Performing a subtraction operation (e.g., HS terminal voltage minus HB terminal voltage) in the logic block 214 using the measured voltage values as operands provides a result of as much as approximately a diode threshold voltage measured across diode circuit 226. In this example, the measured voltage across diode circuit 226 may be in a range of −100 to −700 millivolts. A second predetermined error threshold value may be set at −50 millivolts, for example, in a control register of logic block 214. In this example, the second threshold has a same magnitude as the first threshold described in the second example above. The measured voltage is compared with the error threshold value and when exceeded, the logic block 214 generates an HS open wire error indication. Because the measured voltage across diode circuit 226 exceeds the second predetermined error threshold, the HS open wire error indication may be stored as a flag in an error register of logic block 214 and communicated with a main battery management controller by way of communications circuitry of logic block 214 at output OUT.

In a fourth example, when an open circuit occurs in conductive path 110, the voltage measured at the LB terminal is significantly higher than the voltage measured at the LS terminal. Because the LB terminal is no longer connected to the battery terminal, a voltage increase occurs across the diode circuit 228. Performing a subtraction operation (e.g., LS terminal voltage minus LB terminal voltage) in the logic block 214 using the measured voltage values as operands provides a result of as much as approximately a diode threshold voltage measured across diode circuit 228. In this example, the measured voltage across diode circuit 228 may be in a range of −100 to −700 millivolts. A third predetermined error threshold value may be set at −50 millivolts, for example, in a control register of logic block 214. The measured voltage across diode circuit 228 is compared with the third error predetermined threshold value and when exceeded, the logic block 214 generates an LB open wire error indication. Because the measured voltage across diode circuit 226 exceeds the third predetermined error threshold, the LB open wire error indication may be stored as a flag in an error register of logic block 214 and communicated with a main battery management controller by way of communications circuitry of logic block 214 at output OUT.

In a fifth example, when an open circuit occurs in conductive path 112, the voltage measured at the LS terminal is significantly higher than the voltage measured at the LB terminal. Because the LS terminal is no longer connected to the battery terminal, a voltage increase occurs across the diode circuit 228. Performing a subtraction operation (e.g., LS terminal voltage minus LB terminal voltage) in the logic block 214 using the measured voltage values as operands provides a result of as much as approximately a diode threshold voltage measured across diode circuit 228. In this example, the measured voltage across diode circuit 228 may be in a range of 100 to 700 millivolts. A fourth predetermined error threshold value may be set at +50 millivolts, for example, in a control register of logic block 214. In this example, the fourth threshold has a same magnitude as the third threshold described in the fourth example above. The measured voltage across diode circuit 228 is compared with the third error predetermined threshold value and when exceeded, the logic block 214 generates an LS open wire error indication. Because the measured voltage across diode circuit 226 exceeds the fourth predetermined error threshold, the LS open wire error indication may be stored as a flag in an error register of logic block 214 and communicated with a main battery management controller by way of communications circuitry of logic block 214 at output OUT.

Voltage regulator 224 is configured to provide an operating voltage VSUPPLY to circuitry of ADC 210, ADC 212, and logic block 214. Voltage regulator 224 includes a first input coupled to the positive terminal of battery cell 102 by way of the HB terminal and conductive path 106 and a second input coupled to the negative terminal of battery cell 102 by way of the LB terminal and conductive path 110. Voltage regulator 224 includes an output coupled to provide operating voltage VSUPPLY. In this embodiment, voltage regulator 224 is characterized as a low-dropout (LDO) voltage regulator. In other embodiments, other types of voltage regulators may be employed as voltage regulator 224.

Figure 3:
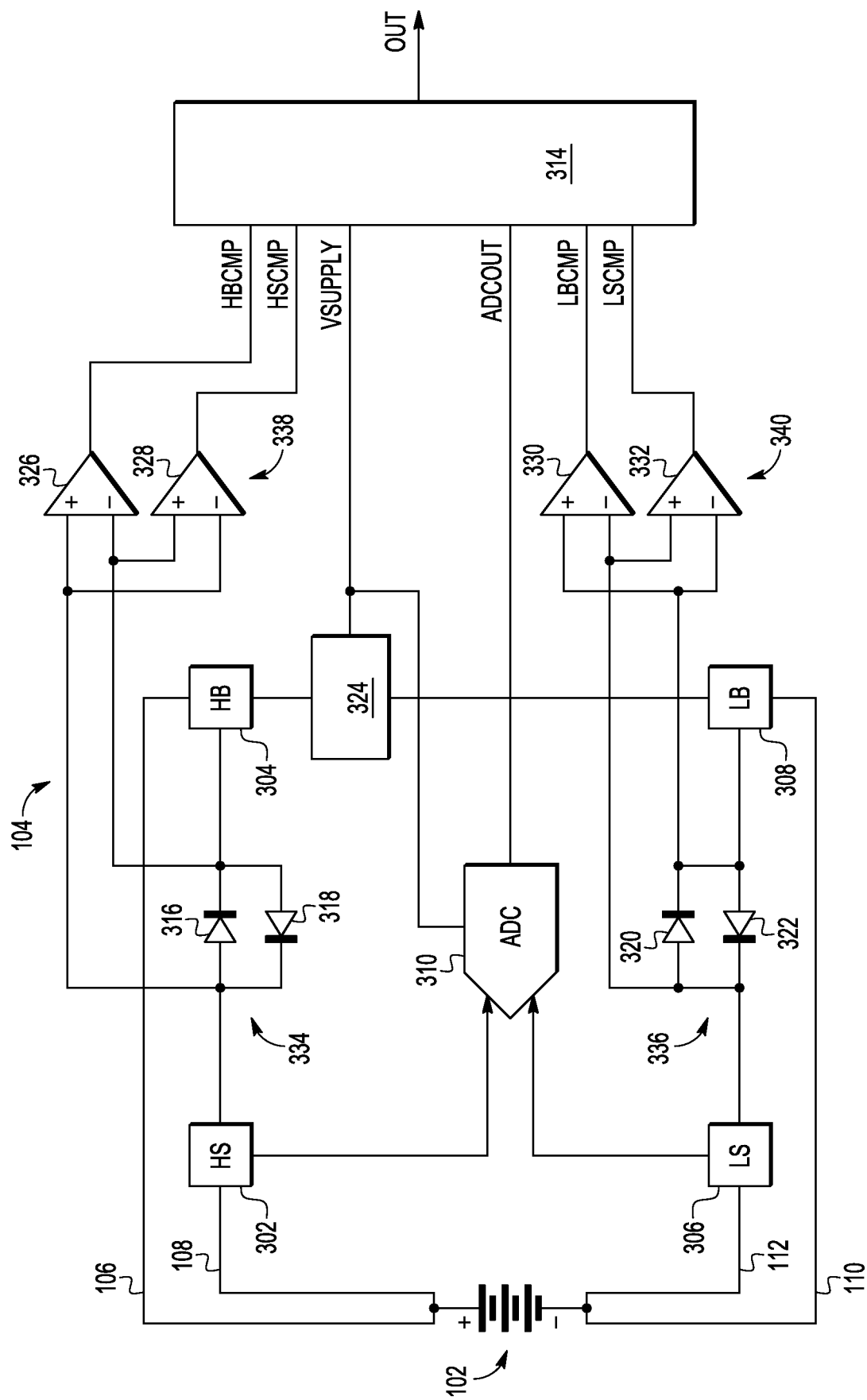
FIG. 3 illustrates, in schematic diagram form, a second example of a more detailed battery management system in accordance with an embodiment.

FIG. 3 illustrates, in schematic diagram form, a second more detailed example battery management system 300 in accordance with an embodiment. System 300 includes battery cell 102 and battery management unit 104 shown in more detail. As described above, the battery cell 102 may be any suitable rechargeable battery cell type. In this embodiment, battery management unit 104 is formed as an integrated circuit and includes circuitry for open wire detection.

In this embodiment, the battery management unit 104 includes terminals 302-308 labeled HB, HS, LB, and LS respectively for electrical connections to battery cell 102, diode circuits 334 and 336, an ADC 310, a first comparator circuit 338, a second comparator circuit 340, logic block 314, and voltage regulator 324. Conductive paths 106-112 provide electrical connections between the positive (+) and negative (−) terminals of battery cell 102 and respective terminals HB, HS, LB, and LS of the battery management unit 104. The conductive paths 106-112 include wiring, conductive traces on a printed circuit board, solder connections, and the like, which forms the electrical connections between the battery cell 102 and the battery management unit 104. In this embodiment, a first conductive path 106 is coupled between the positive terminal of battery cell 104 and the high-side battery terminal labeled HB, and a second conductive path 108 is coupled between the positive terminal of battery cell 104 and the high-side sense terminal labeled HS. Likewise, a third conductive path 110 is coupled between the negative terminal of battery cell 104 and the low-side battery terminal labeled LB, and a fourth conductive path 112 is coupled between the negative terminal of battery cell 104 and the low-side sense terminal labeled LS.

First diode circuit 334 is coupled between the HS and HB terminals and second diode circuit 336 is coupled between the LS and LB terminals of the battery management unit 104. The first diode circuit 334 includes a first diode 316 and a second diode 318 arranged in an antiparallel configuration. In this arrangement, diode 316 has an anode terminal connected to the HS terminal and a cathode terminal connected to the HB terminal, and diode 318 has a cathode terminal connected to the HS terminal and an anode terminal connected to the HB terminal. The second diode circuit 336 includes a first diode 320 and a second diode 322 arranged in an antiparallel configuration. In this arrangement, diode 320 has an anode terminal connected to the LS terminal and a cathode terminal connected to the LB terminal, and diode 322 has a cathode terminal connected to the LS terminal and an anode terminal connected to the LB terminal.

ADC 310 labeled ADC is configured to monitor and measure voltages at the HS and LS terminals respectively. ADC 310 includes a first input coupled to the HS terminal, a second input coupled to the LS terminal, and an output labeled ADCOUT coupled to the logic block 314 for providing digital conversion values representative of measured voltages at the HS and LS terminals. In an embodiment, ADC 310 is characterized as a high-resolution ADC (e.g., 12-bit ADC).

Comparator circuits 338 and 340 are configured to monitor voltages across respective diode circuits 334 and 336. First comparator circuit 338 includes a first comparator 326 and a second comparator 328 connected in parallel across diode circuit 334 and arranged with opposite input polarities. Comparator 326 includes a non-inverting (+) input connected to the HS terminal, an inverting input (−) connected to the HB terminal, and an output for providing a compare signal labeled HBCMP to logic block 314. Comparator 328 includes a non-inverting (+) input connected to the HB terminal, an inverting input (−) connected to the HS terminal, and an output for providing a compare signal labeled HSCMP to logic block 314.

In an embodiment, comparators 326 and 328 are each configured to include a predetermined threshold voltage (e.g., 50 millivolts). For example, when a monitored voltage at the non-inverting input exceeds a voltage at the inverting input by the predetermined threshold voltage amount, the output signal (e.g., HSCMP, HBCMP) is at a logic high level. When the monitored voltage at the non-inverting input is less than the predetermined threshold voltage relative to the voltage at the inverting input, the output signal (e.g., HSCMP, HBCMP) is at a logic low level. Because comparators 326 and 328 are arranged with opposite input polarities, only one of the HSCMP and HBCMP output signals can be at a logic high level at any given time.

Similarly, second comparator circuit 340 includes a first comparator 330 and a second comparator 332 connected in parallel across diode circuit 336 and arranged with opposite input polarities. Comparator 330 includes a non-inverting (+) input connected to the LB terminal, an inverting input (−) connected to the LS terminal, and an output for providing a compare signal labeled LBCMP to logic block 314. Comparator 332 includes a non-inverting (+) input connected to the LS terminal, an inverting input (−) connected to the LB terminal, and an output for providing a compare signal labeled LSCMP to logic block 314.

In an embodiment, comparators 330 and 332 are each configured to include a predetermined threshold voltage (e.g., 50 millivolts). For example, when a monitored voltage at the non-inverting input exceeds a voltage at the inverting input by the predetermined threshold voltage amount, the output signal (e.g., LSCMP, LBCMP) is at a logic high level. When the monitored voltage at the non-inverting input is less than the predetermined threshold voltage relative to the voltage at the inverting input, the output signal (e.g., LSCMP, LBCMP) is at a logic low level. Because comparators 330 and 332 are arranged with opposite input polarities, only one of the LSCMP and LBCMP output signals can be at a logic high level at any given time.

Comparator circuits 338 and 340 along with logic block 314 serve as a detect circuit configured to determine that an open wire exists on conductive paths 106-112 when voltages across the diode circuits 334 and 336 exceed predetermined thresholds, store an open wire error indication, and communicate such error indication with the main battery management controller by way of the output OUT. The diode circuits 334 and 336 serve as detection diode circuits configured for detecting the open wire by having a detectable voltage across the detection diode circuits when the open wire exists. In an embodiment, the first and second diode circuits 334 and 336 are formed as electrostatic discharge (ESD) diode circuits and are utilized as the detection diode circuits. In this arrangement, the first and second diode circuits 334 and 336 are configured to protect circuitry of the battery management unit 104 during ESD events at the HS, HB, LS, and LB terminals in addition to serving as detection diode circuits. In an embodiment, communications circuitry of logic block 314 for communicating with the main battery management controller may be a serial communication interface. In other embodiments, other communication circuitry for communicating with the main battery management controller may be employed.

Logic block 314 includes logic circuits configured to perform control, operational, and communication functions among other functions. The logic block 314 is coupled to receive output signals HBCMP, HSCMP, LBCMP, and LSCMP from comparator circuits 338 and 340. Each of output signals HBCMP, HSCMP, LBCMP, and LSCMP provides an indication when a voltage across respective diode circuits 334 and 336 exceeds a predetermined threshold.

In a first example, when conductive paths 106 and 108 are intact, the voltage at the HS terminal is approximately the same as the voltage at the HB terminal. Accordingly, approximately 0 (zero) volts exists across diode circuit 334 and output signals HBCMP and HSCMP are at a logic low level. Likewise, when conductive paths 110 and 112 are intact, the voltage at the LS terminal is approximately the same as the voltage at the LB terminal. Accordingly, approximately 0 (zero) volts exists across diode circuit 336 and output signals LBCMP and LSCMP are at a logic low level.

In a second example, when an open circuit occurs in conductive path 106, the voltage at the HB terminal is significantly lower than the voltage at the HS terminal. Because the HB terminal is no longer connected to the battery terminal, a voltage drop occurs across the diode circuit 334. A resulting voltage across diode circuit 334 may be in a range of 100 to 700 millivolts. In this example, the comparator 326 is configured to have a first predetermined error threshold value set at +50 millivolts relative to the voltage at the HB terminal. Because the voltage across diode circuit 334 exceeds the first predetermined error threshold, the output signal HBCMP from comparator 326 is at a logic high level and provides an HB open wire error indication. The HB open wire error indication may be stored as a flag in an error register of logic block 314 and communicated with a main battery management controller by way of communications circuitry of logic block 314 at output OUT.

In a third example, when an open circuit occurs in conductive path 108, the voltage at the HS terminal is significantly lower than the voltage at the HB terminal. Because the HS terminal is no longer connected to the battery terminal, a voltage drop occurs across the diode circuit 334. A resulting voltage across diode circuit 334 may be in a range of −100 to −700 millivolts. In this example, the comparator 328 is configured to have a second predetermined error threshold value set at −50 millivolts relative to the voltage at the HB terminal. Because the voltage across diode circuit 334 exceeds the second predetermined error threshold, the output signal HSCMP from comparator 328 is at a logic high level and provides an HS open wire error indication. The HS open wire error indication may be stored as a flag in an error register of logic block 314 and communicated with a main battery management controller by way of communications circuitry of logic block 314 at output OUT.

In a fourth example, when an open circuit occurs in conductive path 110, the voltage at the LB terminal is significantly higher than the voltage at the LS terminal. Because the LB terminal is no longer connected to the battery terminal, a voltage increase occurs across the diode circuit 336. A resulting voltage across diode circuit 336 may be in a range of −100 to −700 millivolts. In this example, the comparator 330 is configured to have a third predetermined error threshold value set at −50 millivolts relative to the voltage at the LB terminal. Because the voltage across diode circuit 336 exceeds the third predetermined error threshold, the output signal LBCMP from comparator 330 is at a logic high level and provides an LB open wire error indication. The LB open wire error indication may be stored as a flag in an error register of logic block 314 and communicated with a main battery management controller by way of communications circuitry of logic block 314 at output OUT.

In a fifth example, when an open circuit occurs in conductive path 112, the voltage at the LS terminal is significantly higher than the voltage at the LB terminal. Because the LS terminal is no longer connected to the battery terminal, a voltage increase occurs across the diode circuit 336. A resulting voltage across diode circuit 336 may be in a range of 100 to 700 millivolts. In this example, the comparator 332 is configured to have a fourth predetermined error threshold value set at +50 millivolts relative to the voltage at the LB terminal. Because the voltage across diode circuit 336 exceeds the fourth predetermined error threshold, the output signal LSCMP from comparator 332 is at a logic high level and provides an LS open wire error indication. The LS open wire error indication may be stored as a flag in an error register of logic block 314 and communicated with a main battery management controller by way of communications circuitry of logic block 314 at output OUT.

Voltage regulator 324 is configured to provide an operating voltage VSUPPLY to circuitry of ADC 310, comparator circuits 334 and 336, and logic block 314. Voltage regulator 324 includes a first input coupled to the positive terminal of battery cell 102 by way of the HB terminal and conductive path 106 and a second input coupled to the negative terminal of battery cell 102 by way of the LB terminal and conductive path 110. Voltage regulator 324 includes an output coupled to provide operating voltage VSUPPLY. In this embodiment, voltage regulator 324 is characterized as a low-dropout (LDO) voltage regulator. In other embodiments, other types of voltage regulators may be employed as voltage regulator 324.

Figure 4:
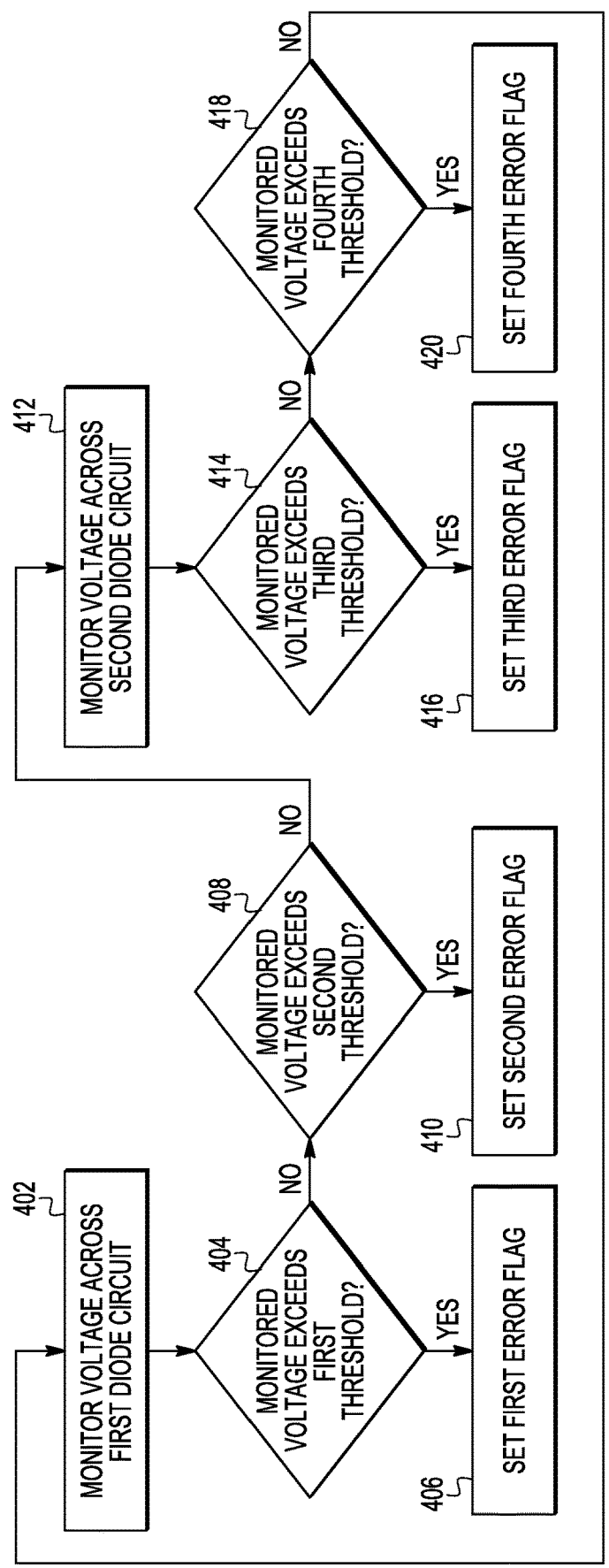
FIG. 4 illustrates, in flow diagram form, an example method of detecting an open wire in accordance with an embodiment.

FIG. 4 illustrates, in simplified flow diagram form, an example method 400 of detecting an open wire in accordance with an embodiment. In this embodiment, the method 400 includes detecting an open wire (e.g., an open circuit in any of conductive paths 106-112) by monitoring voltages across diode circuits (e.g., diode circuits 226-228, 334-336). In the event that a monitored voltage across a diode circuit exceeds a predetermined threshold, an open wire is detected, and an open wire error indication is stored as an error flag. The diode circuits serve as detection diode circuits configured for detecting the open wire by having a detectable voltage across the detection diode circuits when the open wire exists.

At step 402, monitor voltage across a first diode circuit. In this embodiment, the first diode circuit (e.g., diode circuit 226 of FIG. 2, diode circuit 334 of FIG. 3) is formed as an antiparallel diode pair as described above. Circuitry such as the ADCs 210 and 212 in the example battery management unit 104 of FIG. 2 and the comparator circuit 338 in the example battery management unit 104 of FIG. 3 are coupled to monitor voltages across the first diode circuit.

At step 404, determine whether the monitored voltage across the first diode circuit exceeds a first threshold. When an open circuit exist in a conductive path such as conductive paths 106-108 between the positive terminal of battery cell 102 and battery management unit 104, a significant voltage (e.g., 100-700 millivolts) exists across the first diode circuit. Circuitry of the battery management unit as described above is configured to generate an error indication when the monitored voltage exceeds a predetermined threshold. If the monitored voltage exceeds the first threshold, then (yes) proceed at step 406. If the monitored voltage does not exceed the first threshold, then (no) proceed at step 408.

At step 406, set a first error flag. When the monitored voltage exceeds the first threshold, an error indication is generated and stored by setting a first error flag in an error register, for example, such as located in logic block 214 of FIG. 2 and logic block 314 of FIG. 3.

At step 408, determine whether the monitored voltage across the first diode circuit exceeds a second threshold. In this embodiment, the second threshold by have a same magnitude as the first threshold but opposite polarity. If the monitored voltage exceeds the first threshold, then (yes) proceed at step 410. If the monitored voltage does not exceed the first threshold, then (no) proceed at step 412.

At step 410, set a second error flag. When the monitored voltage exceeds the second threshold, an error indication is generated and stored by setting a second error flag in an error register, for example, such as located in logic block 214 of FIG. 2 and logic block 314 of FIG. 3.

At step 412, monitor voltage across a second diode circuit. In this embodiment, the second diode circuit (e.g., diode circuit 228 of FIG. 2, diode circuit 336 of FIG. 3) is formed as an antiparallel diode pair as described above. Circuitry such as the ADCs 210 and 212 in the example battery management unit 104 of FIG. 2 and the comparator circuit 340 in the example battery management unit 104 of FIG. 3 are coupled to monitor voltages across the second diode circuit.

At step 414, determine whether the monitored voltage across the second diode circuit exceeds a third threshold. When an open circuit exist in a conductive path such as conductive paths 110-112 between the negative terminal of battery cell 102 and battery management unit 104, a significant voltage (e.g., 100-700 millivolts) exists across the second diode circuit. If the monitored voltage exceeds the third threshold, then (yes) proceed at step 416. If the monitored voltage does not exceed the third threshold, then (no) proceed at step 418.

At step 416, set a third error flag. When the monitored voltage exceeds the third threshold, an error indication is generated and stored by setting a third error flag in an error register, for example, such as located in logic block 214 of FIG. 2 and logic block 314 of FIG. 3.

At step 418, determine whether the monitored voltage across the second diode circuit exceeds a fourth threshold. In this embodiment, the fourth threshold by have a same magnitude as the third threshold but opposite polarity. If the monitored voltage exceeds the fourth threshold, then (yes) proceed at step 420. If the monitored voltage does not exceed the first threshold, then (no) proceed at step 402.

At step 420, set a fourth error flag. When the monitored voltage exceeds the fourth threshold, an error indication is generated and stored by setting a fourth error flag in an error register, for example, such as located in logic block 214 of FIG. 2 and logic block 314 of FIG. 3.

Generally, there is provided, a semiconductor device including a first diode having an anode terminal coupled to a first terminal and a cathode terminal coupled to a second terminal, the first and second terminals configured for connection to a first battery cell terminal by way of a first conductive path and a second conductive path; and a detect circuit coupled to the first diode, the detect circuit configured to provide a first open wire indication when a first voltage across the first diode exceeds a first threshold. The device may further include a second diode coupled in parallel with the first diode, the second diode having a cathode terminal coupled to the first terminal and an anode terminal coupled to the second terminal; wherein the detect circuit is further configured to provide a second open wire indication when the first voltage exceeds a second threshold. The first voltage across the first diode may exceed the first threshold when an open circuit occurs in the second conductive path, and wherein the first voltage across the second diode may exceed the second threshold when an open circuit occurs in the first conductive path. The detect circuit may include a first comparator having a non-inverting input coupled to the anode terminal of the first diode and an inverting input coupled to the cathode terminal of the first diode, the first comparator configured to provide a first output signal indicative of the first voltage exceeding the first threshold; and a second comparator having a non-inverting input coupled to the anode terminal of the second diode and an inverting input coupled to the cathode terminal of the second diode, the second comparator configured to provide a second output signal indicative of the first voltage exceeding the second threshold. The device may further include a logic block configured to store a first value in a first register bit based on the first output signal and store the first value in a second register bit based on the second output signal, the logic block further configured to communicate values stored in the register bits by way of serial communication circuitry. The device may further include a third diode having an anode terminal coupled to a third terminal and a cathode terminal coupled to a fourth terminal, the third and fourth terminals configured for connection to a second battery cell terminal by way of a third conductive path and a fourth conductive path; wherein the detect circuit is further coupled to detect a second voltage across the third diode and is further configured to provide a third open wire indication when the second voltage exceeds a third threshold. The device may further include a fourth diode coupled in parallel with the third diode, the fourth diode having a cathode terminal coupled to the third terminal and an anode terminal coupled to the fourth terminal; wherein the detect circuit is further configured to provide a fourth open wire indication when the second voltage exceeds a fourth threshold. The detect circuit may further include a first analog to digital converter (ADC) having a first input coupled to the first terminal and a second input coupled to the third terminal, the first ADC having an output coupled to a logic block to provide a first conversion value corresponding to a first terminal voltage at the first input and a second conversion value corresponding to a third terminal voltage at the second input; and a second ADC having a first input coupled to the second terminal and a second input coupled to the fourth terminal, the second ADC having an output coupled to the logic block to provide a third conversion value corresponding to a second terminal voltage at the first input and a fourth conversion value corresponding to a fourth terminal voltage at the second input. The logic block may be configured to calculate the first voltage or the second voltage based on the first, second, third and fourth conversion values.

In another embodiment, there is provided, a semiconductor device including a first antiparallel diode pair coupled between a first terminal and a second terminal, the first and second terminals configured for connection to a positive battery cell terminal by way of a first conductive path and a second conductive path; and a detect circuit coupled to the first antiparallel diode pair, the detect circuit configured to provide a first open wire indication when a first voltage across the first antiparallel diode pair exceeds a first threshold. The detect circuit may be further configured to provide a second open wire indication when the first voltage exceeds a second threshold, the second threshold having a same magnitude as the first threshold. The first voltage across the first antiparallel diode pair may exceed the first threshold when an open circuit occurs in the first conductive path, and wherein the first voltage across the first antiparallel diode pair may exceed the second threshold when an open circuit occurs in the second conductive path. The detect circuit may include a first comparator having a non-inverting input coupled to the first terminal and an inverting input coupled to the second terminal, the first comparator configured to provide a first output signal indicative of the first voltage exceeding the first threshold; and a second comparator having a non-inverting input coupled to the second terminal of and an inverting input coupled to the first terminal, the second comparator configured to provide a second output signal indicative of the first voltage exceeding the second threshold. The device may further include a second antiparallel diode pair coupled between a third terminal and a fourth terminal, the third and fourth terminals configured for connection to a negative battery cell terminal by way of a third conductive path and a fourth conductive path; wherein the detect circuit is further coupled to detect a second voltage across the second antiparallel diode pair, the detect circuit further configured to provide a third open wire indication when the second voltage exceeds a third threshold. The device may further include a voltage regulator coupled between the second terminal and the fourth terminal, the voltage regulator configured to provide an operating voltage for the detect circuit. The detect circuit may include a first ADC having a first input coupled to the first terminal, a second input coupled to the third terminal, and an output coupled to a logic block, the first ADC configured to provide at the output a first conversion value corresponding to a first terminal voltage at the first input and a second conversion value corresponding to a third terminal voltage at the second input; and a second ADC having a first input coupled to the second terminal and a second input coupled to the fourth terminal, and an output coupled to the logic block, the second ADC configured to provide at the output a third conversion value corresponding to a second terminal voltage at the first input and a fourth conversion value corresponding to a fourth terminal voltage at the second input. The logic block may be configured to calculate the first voltage or the second voltage based on the first, second, third and fourth conversion values.

In yet another embodiment, there is provided, a method including providing a first diode circuit between a first terminal and a second terminal, the first and second terminals configured for connection to a first battery cell terminal by way of a first conductive path and a second conductive path; determining that a first voltage across the first diode circuit exceeds a first threshold; generating a first open wire indication when the first voltage across the first diode circuit exceeds a first threshold. The first voltage across the first diode circuit may exceed the first threshold when an open circuit occurs in the first conductive path or the second conductive path. The first diode circuit may be configured to protect circuitry when an ESD event occurs at the first or second terminals.

By now it should be appreciated that there has been provided, a battery management system that includes open wire detection. A diode circuit is coupled between terminals of a battery management unit. The terminals of the battery management unit are connected to terminals of a battery cell by way of conductive paths. Monitor circuitry of the battery management unit is configured to monitor a voltage across the diode circuit. An open circuit in a conductive path is detected when a voltage across the diode circuit exceeds a predetermined threshold.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
 a first diode having an anode terminal coupled to a first terminal and a cathode terminal coupled to a second terminal, the first and second terminals configured for connection to a first battery cell terminal by way of a first conductive path and a second conductive path, the first diode configured to protect circuitry when an ESD event occurs at the first or second terminals; and
 a detect circuit coupled to the first diode, the detect circuit configured to provide a first open wire indication when a first voltage across the first diode exceeds a first threshold.

2. The device of claim 1, further comprises:
 a second diode coupled in parallel with the first diode, the second diode having a cathode terminal coupled to the first terminal and an anode terminal coupled to the second terminal;
 wherein the detect circuit is further configured to provide a second open wire indication when the first voltage exceeds a second threshold.

3. The device of claim 2, wherein the first voltage across the first diode exceeds the first threshold when an open circuit occurs in the second conductive path, and wherein the first voltage across the second diode exceeds the second threshold when an open circuit occurs in the first conductive path.

4. The device of claim 2, wherein the detect circuit comprises:
 a first comparator having a non-inverting input coupled to the anode terminal of the first diode and an inverting input coupled to the cathode terminal of the first diode, the first comparator configured to provide a first output signal indicative of the first voltage exceeding the first threshold; and
 a second comparator having a non-inverting input coupled to the anode terminal of the second diode and an inverting input coupled to the cathode terminal of the second diode, the second comparator configured to provide a second output signal indicative of the first voltage exceeding the second threshold.

5. The device of claim 4, further comprising a logic block configured to store a first value in a first register bit based on the first output signal and store the first value in a second register bit based on the second output signal, the logic block further configured to communicate values stored in the register bits by way of serial communication circuitry.

6. The device of claim 2, further comprising:
 a third diode having an anode terminal coupled to a third terminal and a cathode terminal coupled to a fourth terminal, the third and fourth terminals configured for connection to a second battery cell terminal by way of a third conductive path and a fourth conductive path;
 wherein the detect circuit is further coupled to detect a second voltage across the third diode and is further configured to provide a third open wire indication when the second voltage exceeds a third threshold.

7. The device of claim 6, further comprises:
 a fourth diode coupled in parallel with the third diode, the fourth diode having a cathode terminal coupled to the third terminal and an anode terminal coupled to the fourth terminal;
 wherein the detect circuit is further configured to provide a fourth open wire indication when the second voltage exceeds a fourth threshold.

8. The device of claim 7, wherein the detect circuit further comprises:
 a first analog to digital converter (ADC) having a first input coupled to the first terminal and a second input coupled to the third terminal, the first ADC having an output coupled to a logic block to provide a first conversion value corresponding to a first terminal voltage at the first input and a second conversion value corresponding to a third terminal voltage at the second input; and
 a second ADC having a first input coupled to the second terminal and a second input coupled to the fourth terminal, the second ADC having an output coupled to the logic block to provide a third conversion value corresponding to a second terminal voltage at the first input and a fourth conversion value corresponding to a fourth terminal voltage at the second input.

9. The device of claim 8, wherein the logic block is configured to calculate the first voltage or the second voltage based on the first, second, third and fourth conversion values.

10. A semiconductor device comprising:
 a first antiparallel diode pair coupled between a first terminal and a second terminal, the first and second terminals configured for connection to a positive battery cell terminal by way of a first conductive path and a second conductive path, the first antiparallel diode pair configured to protect circuitry when an ESD event occurs at the first or second terminals; and a detect circuit coupled to the first antiparallel diode pair, the detect circuit configured to provide a first open wire indication when a first voltage across the first antiparallel diode pair exceeds a first threshold.

11. The device of claim 10, wherein the detect circuit is further configured to provide a second open wire indication when the first voltage exceeds a second threshold, the second threshold having a same magnitude as the first threshold.

12. The device of claim 11, wherein the first voltage across the first antiparallel diode pair exceeds the first threshold when an open circuit occurs in the first conductive path, and wherein the first voltage across the first antiparallel diode pair exceeds the second threshold when an open circuit occurs in the second conductive path.

13. The device of claim 11, wherein the detect circuit comprises:
 a first comparator having a non-inverting input coupled to the first terminal and an inverting input coupled to the second terminal, the first comparator configured to provide a first output signal indicative of the first voltage exceeding the first threshold; and
 a second comparator having a non-inverting input coupled to the second terminal of and an inverting input coupled to the first terminal, the second comparator configured to provide a second output signal indicative of the first voltage exceeding the second threshold.

14. The device of claim 11, further comprising:
 a second antiparallel diode pair coupled between a third terminal and a fourth terminal, the third and fourth terminals configured for connection to a negative battery cell terminal by way of a third conductive path and a fourth conductive path;
 wherein the detect circuit is further coupled to detect a second voltage across the second antiparallel diode pair, the detect circuit further configured to provide a third open wire indication when the second voltage exceeds a third threshold.

15. The device of claim 14, further comprising a voltage regulator coupled between the second terminal and the fourth terminal, the voltage regulator configured to provide an operating voltage for the detect circuit.

16. The device of claim 14, wherein the detect circuit comprises:

a first ADC having a first input coupled to the first terminal, a second input coupled to the third terminal, and an output coupled to a logic block, the first ADC configured to provide at the output a first conversion value corresponding to a first terminal voltage at the first input and a second conversion value corresponding to a third terminal voltage at the second input; and a second ADC having a first input coupled to the second terminal and a second input coupled to the fourth terminal, and an output coupled to the logic block, the second ADC configured to provide at the output a third conversion value corresponding to a second terminal voltage at the first input and a fourth conversion value corresponding to a fourth terminal voltage at the second input.

17. The device of claim 16, wherein the logic block is configured to calculate the first voltage or the second voltage based on the first, second, third and fourth conversion values.

18. A method comprising:
 providing a first diode circuit between a first terminal and a second terminal, the first and second terminals configured for connection to a first battery cell terminal by way of a first conductive path and a second conductive path, the first diode circuit configured to protect circuitry when an ESD event occurs at the first or second terminals;
 determining that a first voltage across the first diode circuit exceeds a first threshold; and
 generating a first open wire indication when the first voltage across the first diode circuit exceeds a first threshold.

19. The method of claim 18, wherein the first voltage across the first diode circuit exceeds the first threshold when an open circuit occurs in the first conductive path or the second conductive path.

20. The method of claim 18, wherein the first diode circuit comprises:
 a first ESD diode having an anode terminal coupled to the first terminal and a cathode terminal coupled to the second terminal; and
 a second ESD diode having a cathode terminal coupled to the first terminal and an anode terminal coupled to the second terminal.

* * * * *